United States Patent [19]

Tanaka et al.

[11] 4,203,733
[45] May 20, 1980

[54] ALUMINUM NITRIDE SINTERED BODY COATED WITH ALUMINA

[75] Inventors: Hiroshi Tanaka; Yoshihiro Yamamoto, both of Nagoya, Japan

[73] Assignee: NGK Spark Plug Co., Ltd., Nagoya, Japan

[21] Appl. No.: 934,285

[22] Filed: Aug. 16, 1978

[30] Foreign Application Priority Data

Aug. 16, 1977 [JP] Japan .................................. 52-97509

[51] Int. Cl.² .............................................. B24D 3/06
[52] U.S. Cl. ...................................... 51/295; 51/309; 106/73.4; 264/60; 427/215
[58] Field of Search ........................... 51/307, 295, 309; 106/65, 69, 73.4; 427/215, 219; 264/60

[56] References Cited

U.S. PATENT DOCUMENTS

| | | | |
|---|---|---|---|
| 2,947,056 | 8/1960 | Csordas et al. | 51/309 |
| 3,409,416 | 11/1968 | Yates | 51/309 |
| 3,705,025 | 12/1972 | Daniels | 51/309 |

Primary Examiner—Donald J. Arnold
Attorney, Agent, or Firm—Sughrue, Rothwell, Mion, Zinn and Macpeak

[57] ABSTRACT

An aluminum nitride sintered body, especially suitable as a material for high-speed cutting tools, having on the surface thereof a coating of alumina crystals having an average particle diameter of about 2.5 microns or less.

8 Claims, 3 Drawing Figures

ALUMINUM NITRIDE SINTERED BODY COATED WITH ALUMINA

BACKGROUND OF THE INVENTION

1. Field of the Invention

This invention relates to an improvement in an aluminum nitride sintered body, and more specifically, to an improvement in the use of a ceramic sintered body composed mainly of aluminum nitride in high-speed machining tools and other applications.

2. Description of the Prior Art

A sintered body of aluminum nitride (hereinafter "AlN") has high thermal conductivity and thermal shock resistance and superior corrision resistance to molten metals, and therefore has attracted attention as thermally stable materials for various uses. Especially in cutting tool applications, AlN generally has a hardness of 70 or less (Rockwell 45 N), and an improved AlN sintered body disclosed in Japanese patent application (OPI) No. 151704/75 (The term "OPI" as used herein refers to a "published unexamined Japanese patent application".) has a hardness of 85 at the highest. On the other hand, an alumina-type sintered body has a hardness of 88 to 92. For this reason, ceramic tools made of AlN sintered body have unsatisfactory abrasion resistance. Furthermore, since AlN becomes unstable when heated in the presence of moisture, the production of cutting tools from AlN has not yet been successful.

An AlN sintered body has good electrical insulation characteristics, and by improving the high-temperature corrosion resistance of an AlN sintered body to moisture, it can be employed as cutting tools in various fields. In particular, such AlN sintered bodies can be utilized effectively in machine elements having heat resistance at high temperatures, component parts of gas turbines, and various electrically insulating base materials for high-temperature applications.

SUMMARY OF THE INVENTION

An object of this invention is to remove the defects of prior art AlN sintered bodies.

According to this invention, this invention provides a ceramic sintered body comprising mainly aluminum nitride having on the surface thereof a coating of crystals of alumina having a diameter of about 2.5 microns or less.

BRIEF DESCRIPTION OF THE ACCOMPANYING DRAWINGS

FIG. 1 schematically shows an alumina-coated AlN sintered body of this invention in which 1 represents the AlN sintered body, and 2 represents the alumina coating;

FIG. 2 shows one example of forming an alumina coating using a chemical vacuum deposition method; and FIG. 3 is a diagram showing the relationship of the relative density (%), as the abscissa, of an AlN sintered body containing Mo to the thermal conductivity (cal/cm. sec. °C.), as the left ordinate, of the AlN sintered body and the hardness (Rockwell 45N), as the right ordinate, of the AlN sintered body. The circles and the solid line show thermal conductivity, and the triangles and the dotted line show hardness.

DETAILED DESCRIPTION OF THE INVENTION

Figure 1:
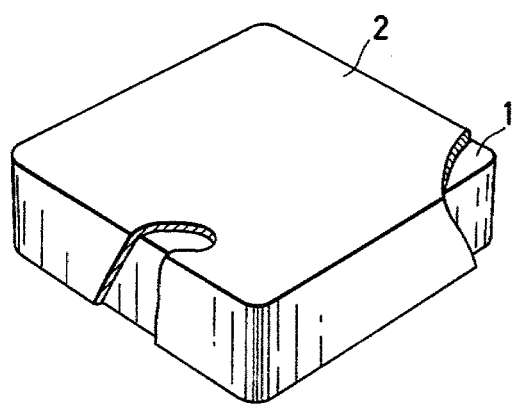

According to this invention, as shown in FIG. 1, a ceramic sintered body composed mainly of AlN, e.g., at least about 97 volume % of AlN, is used as a base material 1, and a thin layer or coating of alumina 2 is formed on the surface of the ceramic sintered body. The formation of the thin alumina layer can be performed by depositing alumina on the surface of the AlN body by chemical vacuum deposition (CVD). Conventional chemical vacuum deposition techniques, e.g., as disclosed in U.S. Pat. No. 2,962,388, can be used.

It has been found in accordance with this invention that by adjusting the average particle diameter of the alumina crystals used in this invention to about 2.5 microns or less, the wear of a cutting tool ultimately obtained can be reduced. A better alumina coating can be obtained when the average particle diameter of the alumina crystals is 1 micron or less. The thickess of the layer or coating of the alumina crystals can be about 2 to 30 microns.

Chemicals vacuum deposition of alumina can be performed easily by, for example, passing a gaseous mixture of $AlCl_3$, $CO_2$ and $H_2$, and optionally CO, into a reaction vessel containing an AlN ceramic sintered body heated to 1000° to 1100° C. The treating temperature is selected within the range of 900° to 1300° C. according to the conditions. A suitable pressure in the reaction vessel can range from about 10 to 100 torr, preferably 20 to 30 torr. When the temperature is too high, the average particle diameter of the alumina becomes large, and the compactness of the resulting coated AlN ceramic sintered body tends to be lost. It is desirable, therefore, to treat the AlN ceramic sintered body for a long time within a relatively low temperature range, e.g., 900° to 1100° C.

The thickness of the alumina coating is suitably about 2 to about 10 microns, preferably 3 to 5 microns, for use as cutting tools although the thickness will vary depending upon the average crystal particle diameter. This thickness range set forth above is such that the abrasion resistance of alumina is exhibited and thermal cracks do not occur by an excessively large temperature gradient on the surface layer at the time of machining. When the final product is to be used in applications other than cutting tools, the thickness can be selected according to the purposes and characteristics of such applications.

The reaction in accordance with CVD takes place in accordance with the following

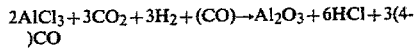

At this time, aluminum oxynitride, AlON, is sometimes formed on the surface of contact between the AlN base material and the coating. This was ascertained by the identification of crystals by X-ray diffraction analysis and analysis using an X-ray microanalyzer. Accordingly, the presence of a very thin interlayer of AlON is included within the scope of the present invention. $N^{-3}$ ion on the surface of the AlN sintered body can be formed simultaneously with the precipitation of the alumina in accordance with the following

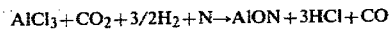

Desposition of the thin alumina film in accordance with this invention can also be performed using a physical vacuum deposition method (PVD) and sputtering.

Such an AlN sintered body can be prepared by heating Al powder at about 820° to 1000° C. in an atmosphere of nitrogen gas or, alternatively, a mixture of aluminum oxide and carbon is heated in a nitrogen atmosphere using an electric furnace to produce aluminum nitride according to the following

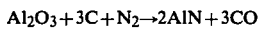

and then the AlN is hot pressed, e.g., at a temperature of about 1650° C. to 1850° C. and a pressure of about 100 kg/cm² to 300 kg/cm², to sinter and form an AlN sintered ceramic body.

An AlN sintered body containing at least about 97% by volume of AlN and about 3% by volume or less, calculated as metal, of Mo, W or both as a metal or as a carbide thereof and/or $Y_2O_3$, or a known AlN sintered body containing a small amount of $Y_2O_3$ or $SiO_2$ can also be used as the AlN sintered body used in this invention. In either case, when the AlN has a density which is at least 95% of the theoretical density, the object of this invention can be effectively achieved.

Thermal conductivity is a superior property of the AlN sintered body. When the relative density (the density in terms of % relative to the theoretical density) of the AlN sintered body is at least 95%, the thermal conductivity of the AlN sintered body increases in proportion to the relative density of the AlN sintered body, as shown in FIG. 3.

Figure 3:
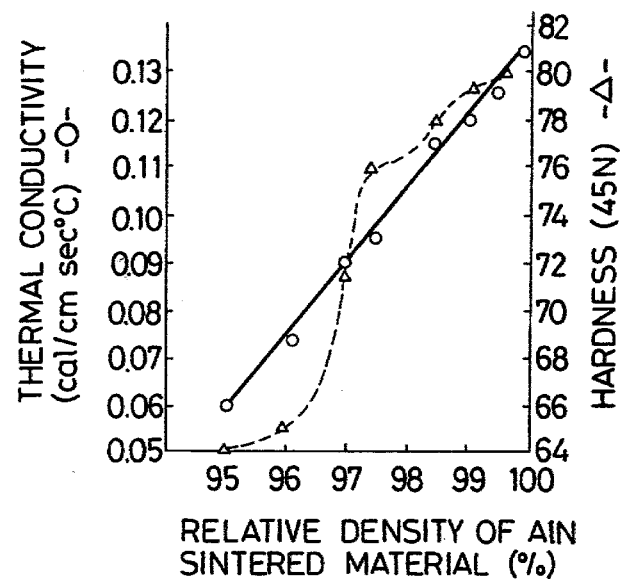

FIG. 3 shows the relationship of the relative density of an AlN sintered body of 100 parts by volume of AlN and 0 to 0.15 parts by volume of Mo to the hardness (Rockwell 45N) and the thermal conductivity (cal/cm. sec. °C.) of the body. The parts of volume, as used herein, refer to theoretical volume proportions of the individual components. FIG. 3 shows the results of measurement of a sample obtained by hot-pressing AlN powder having an average particle diameter of 2 microns, in an atmosphere of $N_2$ at 250 kg/cm² and 1750° C. for 1 hour.

For use as a high-speed cutting tool, a relative density of at least 97% is preferred because when the AlN sintered body has a relative density of 97%, a thermal conductivity of 0.09 cal/cm. sec. °C. and a hardness (45N) of 72 are obtained. Most preferably, the relative density is at least 99%. This is because, high thermal conductivity and high hardness are required for use as high-speed cutting tools. In contrast, an $Al_2O_3$ sintered body has a thermal conductivity of about 0.05 cal/cm. sec. °C. at the highest.

For use in other applications, it is not always necessary for the AlN sintered body to meet the requirements for cutting tools as described above.

Various methods are known to form an AlN sintered body. For obtaining a high density, pressure sintering methods such as a hot-press method and a hot hydrostatic pressure method are preferred.

Useful additives which can be present in the sintered body, e.g., in an amount of about 3% by volume or less, include Mo, W, $Mo_2C$, WC, $Y_2O_3$ and $SiO_2$. Desirably, these additives should be used in amounts which do not impair the thermal conductivity of the sintered body.

As can be clearly seen from Tables 1 and 2 given hereinbelow, the AlN sintered body coated with alumina has a very good high-speed cutting life. This is because the base material is an AlN sintered body having a superior thermal conductivity. Therefore, heat is not concentrated at the tip of the blade, and consequently the hardness of the alumina layer is maintained high during cutting.

The following example is given to illustrate the present invention in greater detail. Unless otherwise indicated, all parts are by weight.

EXAMPLE 100 parts by volume of commerically available AlN having an average particle diameter of 2 microns was mixed with 1.0 part by volume of WC having an average particle diameter of 0.7 micron. After thorough mixing, the mixture was placed in a graphite mold and hot pressed in an atmosphere of nitrogen at 1750° C. under a pressure of 250 kg/cm₂ for 1 hour to form a plate having a thickness of 5 mm and an area of 100 mm×100 mm.

A rectangular tip, 12.7×12.7×4.8 mm in size, (nose R: 0.8 mm; amount of chamfering: 0.05 mm) was cut out using a diamond wheel, and machined.

Figure 2:
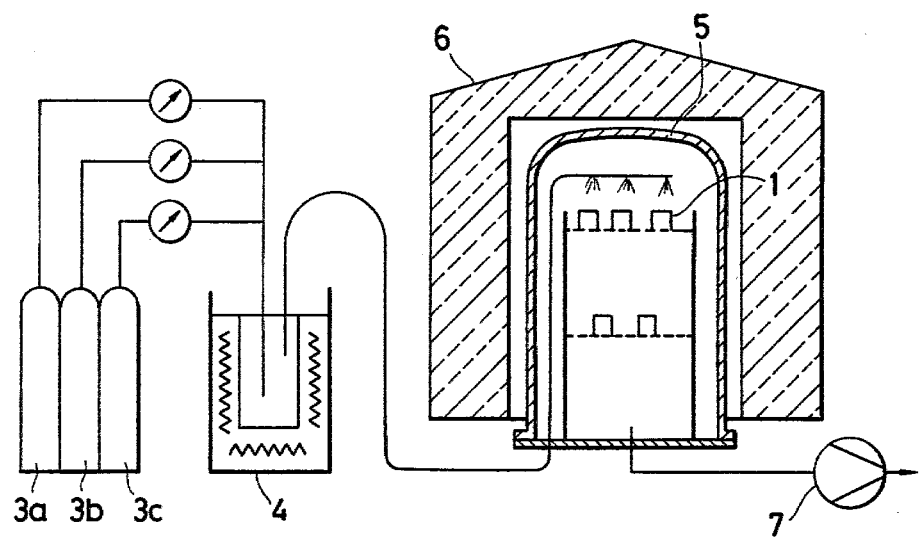

Using an apparatus as described in FIG. 2, the AlN molded product produced as described above was placed in a stainless steel reaction vessel 5, and heated to about 1100° C. in a heating furnace 6. Then, $H_2$, CO and $CO_2$ gases were respectively fed from gas bombs 3a, 3b, 3c, and via an $AlCl_3$ evaporating device 4, were converted to a gaseous mixture of 8% by volume of $AlCl_3$, 30% by volume of CO, 3% by volume of $CO_2$ and 59% by volume of $H_2$. The gaseous mixture was passed through the reaction for 4 hours. The reactor was maintained at 20 to 30 torr by a vacuum pump 7. As a result, an $Al_2O_3$ crystalline layer having a thickness of 3.0 microns precipitated, and the average particle diameter of the alumina crystals was 1.1 microns.

A cutting test using a lathe was performed on the resulting tip, on an AlN tip not coated with an $Al_2O_3$ coating and on a commercially available $Al_2O_3$ ceramic tool (average crystalline particle diameter: 3.4 microns).

| Cutting (1) | |
| --- | --- |
| Workpiece: | cast iron FC 20 |
| Cutting Speed: | 300 m/min., 100 m/min. |
| Depth of Cut: | 1.0 mm |
| Feed: | 0.31 mm/rev. |
| Shape of Tool: | −5, −7, 5, 7, 15, 15, 08 |

The time periods required until the blank wear $V_B$ became 0.4 mm were compared, and the results obtained as shown in Table 1 below.

Table 1

| | Cutting Speed | |
| --- | --- | --- |
| Tool | 300 m/min. | 100 m/min. |
| $Al_2O_3$ - Coated AlN Sintered Body | 150 min. | 180 min. |
| AlN Sintered Body without Coating of $Al_2O_3$ | 5 min. | 40 min. |
| Commercially Available Alumina Tool | 80 min. | 140 min. |

It can be seen from the results in Table 1 above that the AlN sintered body which did not have a coating of $Al_2O_3$ is far inferior to the commercially available alumina tool. The $Al_2O_3$-coated AlN sintered body in accordance with this invention showed far better results than the conventional alumina tool in cutting at a speed of 300 m/min.

| Cutting (2) | |
|---|---|
| Workpiece: | cast iron FC20 |
| Cutting Speed: | 1000 m/min. |
| Depth of Cut: | 0.25 mm |
| Feed: | 0.25 mm/rev. |
| Tool Shape: | Same as Cutting (1) above |

One hundred workpieces, $120\phi \times 20$ l, were cut at the periphery and $V_b$ values were compared. The cutting edge of the tip was honed to 0.05 mm. The results of cutting obtained on these samples are shown in Table 2 below.

Table 2

| | |
|---|---|
| $Al_2O_3$ - Coated AlN Sintered Body | 0.08 mm |
| AlN Sintered Body without Coating of $Al_2O_3$ Coating of $Al_2O_3$ | Cutting impossible |
| Commercially Available Alumina Tool | 0.32 mm |

In high speed cutting, the $Al_2O_3$-coated AlN sintered body in accordance with this invention shows a very long service life as shown in Table 2.

As stated in detail hereinabove, the AlN sintered body in accordance with this invention has superior characteristics for use as cutting tools. It can also be used as materials where high thermal stability and high abrasion resistance are required such as dies, shafts, bearings, ball bearings, mechanical seal rings, and the like.

While the invention has been described in detail and with reference to specific embodiments thereof, it will be apparent to one skilled in the art that various changes and modifications can be made therein without departing from the spirit and scope thereof.

What is claimed is:

1. An aluminum nitride sintered body consisting essentially of a sintered body of aluminum nitride with alumina crystals having an average particle diameter of 2.5 microns or less on the surface of the sintered body.

2. The aluminum nitride sintered body of claim 1, wherein the aluminum nitride sintered body comprises at least 97% by volume of the aluminum nitride and about 3% by volume or less, calculated as the metal, of a member selected from the group consisting of Mo, W, $Mo_2C$ and WC and mixtures thereof.

3. The aluminum nitride sintered body of claim 1, wherein the aluminum nitride sintered body contains about 3% by volume or less of a member selected from the group consisting of $Y_2O_3$ and $SiO_2$.

4. The aluminum nitride sintered body of claim 1, 2 or 3, wherein the aluminum nitride sintered body has a density of at least 95% of the theoretical density.

5. A high-speed cutting tool comprising the aluminum nitride sintered body of claim 1.

6. The aluminum nitride sintered body of claim 1, wherein the alumina crystals are present on the surface at a thickness of about 2 to 30 microns.

7. The aluminum nitride sintered body of claim 6, wherein said thickness is 2–10 microns.

8. The aluminum nitride sintered body of claim 1, wherein the aluminum nitride sintered body has a density of at least 97% of the theoretical density.